United States Patent
Hu et al.

(10) Patent No.: US 11,574,938 B2
(45) Date of Patent: Feb. 7, 2023

(54) CONDENSING ASSEMBLY, VACUUM DRYING DEVICE, AND METHOD FOR MANUFACTURING A DISPLAY SUBSTRATE

(71) Applicant: BOE TECHNOLOGY GROUP CO., LTD., Beijing (CN)

(72) Inventors: Chunjing Hu, Beijing (CN); Wenjun Hou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 76 days.

(21) Appl. No.: 17/052,146

(22) PCT Filed: Jan. 13, 2020

(86) PCT No.: PCT/CN2020/071811
§ 371 (c)(1),
(2) Date: Oct. 30, 2020

(87) PCT Pub. No.: WO2020/147688
PCT Pub. Date: Jul. 23, 2020

(65) Prior Publication Data
US 2021/0143190 A1    May 13, 2021

(30) Foreign Application Priority Data
Jan. 16, 2019   (CN) .......................... 201910041637.8

(51) Int. Cl.
*H01L 51/00* (2006.01)
*H01L 27/12* (2006.01)
(Continued)

(52) U.S. Cl.
CPC ........ *H01L 27/1262* (2013.01); *B32B 38/164* (2013.01); *H01L 51/56* (2013.01); *B32B 2457/206* (2013.01)

(58) Field of Classification Search
CPC .... B41J 11/00; H01L 51/0005; H01L 51/0004
See application file for complete search history.

(56) References Cited

U.S. PATENT DOCUMENTS

| 6,037,001 A * | 3/2000 | Kaloyeros ......... H01L 21/76877 |
| | | 427/124 |
| 2007/0153075 A1* | 7/2007 | Lee ........................... B41J 3/28 |
| | | 347/102 |

(Continued)

FOREIGN PATENT DOCUMENTS

| CN | 102786101 A | 11/2012 |
| CN | 205808003 U | 12/2016 |

(Continued)

OTHER PUBLICATIONS

Translation of DE102012107966 A1 (Deus, et al.) (Aug. 29, 2012). (Year: 2012).*

(Continued)

*Primary Examiner* — Caridad Everhart
(74) *Attorney, Agent, or Firm* — Procopio, Cory, Hargreaves & Savitch LLP

(57) ABSTRACT

A condensation assembly includes a condensation plate and a plurality of sumps. The condensation plate includes a plate body and a plurality of protrusions on a surface of the plate body, and the plurality of protrusions are spaced apart. The plurality of sumps are disposed at a side of the plurality of protrusions away from the plate body. Each sump of the plurality of sumps is disposed opposite to at least one of the plurality of protrusions, and has an opening facing the at least one protrusion disposed opposite to the sump. There is a gap between the plurality of sumps and the condensation plate.

18 Claims, 7 Drawing Sheets

(51) Int. Cl.
*B32B 38/00* (2006.01)
*H01L 51/56* (2006.01)

(56) References Cited

U.S. PATENT DOCUMENTS

| | | | |
|---|---|---|---|
| 2014/0245955 A1* | 9/2014 | Guyaux | C23C 14/246 |
| | | | 118/715 |
| 2017/0004983 A1* | 1/2017 | Madigan | H01L 51/0005 |
| 2017/0092899 A1* | 3/2017 | Bangert | H01L 51/0012 |
| 2020/0358037 A1 | 11/2020 | Wang | |

FOREIGN PATENT DOCUMENTS

| | | | | |
|---|---|---|---|---|
| CN | 207024680 | U | | 2/2018 |
| CN | 207085366 | U | | 3/2018 |
| CN | 107940904 | A | | 4/2018 |
| CN | 207928205 | U | | 10/2018 |
| CN | 108944085 | A | | 12/2018 |
| CN | 109200736 | A | | 1/2019 |
| CN | 109216573 | A | | 1/2019 |
| CN | 109817842 | A | | 5/2019 |
| DE | 102012107966 | | * 10/2013 | ............. C23C 14/12 |

OTHER PUBLICATIONS

Office Action dated Mar. 2, 2020 in counterpart CN Patent Application No. 201910041637.8, 18 pages.
Office Action dated Sep. 30, 2020 in counterpart CN Patent Application No. 201910041637.8, 24 pages.
Office Action dated Dec. 7, 2020 in counterpart CN Patent Application No. 201910041637.8, 19 pages.
Decision of Rejection dated Feb. 2, 2021 in counterpart CN Patent Application No. 201910041637.8, 16 pages.

* cited by examiner

CONDENSING ASSEMBLY, VACUUM DRYING DEVICE, AND METHOD FOR MANUFACTURING A DISPLAY SUBSTRATE

CROSS-REFERENCE TO RELATED APPLICATIONS

This application is a national phase entry under 35 USC 371 of International Patent Application No. PCT/CN2020/071811 filed on Jan. 13, 2020, which claims priority to Chinese Patent Application No. 201910041637.8, filed on Jan. 16, 2019, which are incorporated herein by reference in their entirety.

TECHNICAL FIELD

The present disclosure relates to the field of display technologies, and in particular, to a condensing assembly, a vacuum drying device and a method for manufacturing a display substrate.

BACKGROUND

Organic light-emitting diodes (abbreviated as OLEDs) have advantages of self-luminescence, quick response, wide viewing angle, high brightness, bright color, and being light and thin, and have been widely used in the field of display technologies.

SUMMARY

In an aspect, a condensing assembly is provided. The condensing assembly includes a condensation plate and a plurality of sumps. The condensation plate includes a plate body and a plurality of protrusions on a surface of the plate body, and the plurality of protrusions are spaced apart. The plurality of sumps are disposed at a side of the plurality of protrusions away from the plate body. Each sump of the plurality of sumps is disposed opposite to at least one protrusion of the plurality of protrusions, and an opening of the sump facing the at least one protrusion disposed opposite to the sump. There is a distance between the plurality of sumps and the condensation plate.

In some embodiments, the condensing assembly further includes a plurality of connection members. A first end of one of the plurality of connection members is connected to the sump, and a second end of the connection member is connected to the condensation plate.

In some embodiments, the first end extends into the sump from the opening of the sump, and is connected to a bottom wall or a side wall of the sump. The second end is connected to the at least one protrusion disposed opposite to the sump.

In some embodiments, the sump is fixedly connected to the condensation plate through the connection member, or the sump is detachably connected to the condensation plate through the connection member.

In some embodiments, the plurality of protrusions are arranged in an array.

In some embodiments, each protrusion of the plurality of protrusions is strip-shaped, and the protrusion extends from one end of the plate body to an opposite end of the plate body.

In some embodiments, the plurality of protrusions are parallel to each other.

In some embodiments, a shape of an orthographic projection of at least one of the plurality of protrusions on a plane perpendicular to the plate body is one of a rectangle, a triangle, a trapezoid, and a sector.

In some embodiments, a dimension of the protrusion gradually decreases in a direction pointing from the plate body to the plurality of sumps.

In some embodiments, in a direction perpendicular to the plate body, a distance between the sumps and the condensation plate is in a range of 5 mm to 100 mm.

In another aspect, a vacuum drying device is provided. The vacuum drying device includes a chamber body and the condensing assembly according to some embodiments described above. The chamber body includes a top wall. The condensing assembly is located in a chamber of the chamber body and is disposed on the top wall. The plurality of sumps in the condensing assembly are located at a side of the condensation plate of the condensing assembly away from the top wall.

In some embodiments, the vacuum drying device is configured to perform the drying process on the display substrate manufactured by using the inkjet process. The vacuum drying device further includes at least one of a carrier support or a baking device. The carrier support is located in the chamber and is disposed opposite to the condensing assembly. The carrier support is configured to support the display substrate such that the display substrate is located between the carrier support and the condensing assembly. The baking device is located in the chamber, and the baking device is configured to perform a baking process on the display substrate after the drying process is performed on the display substrate.

In yet another aspect, a method for manufacturing a display substrate is provided. The method for manufacturing the display substrate includes: providing a base, the base having a display area; spraying a solution in the display area by using an inkjet printing process; and performing a drying process on the solution on the base by using the vacuum drying device according to some embodiments described above to form a plurality of thin films, wherein the plurality of thin films are used to form a plurality of sub-pixels.

In some embodiments, the display area includes a plurality of sub-pixel regions corresponding to the plurality of sub-pixels. An orthographic projection of at least one of the plurality of sumps in the vacuum drying device on the base is within a region between two adjacent sub-pixel regions in the plurality of sub-pixel regions.

In some embodiments, the base further has a non-display area located beside the display area. An orthographic projection of at least one of the plurality of sumps in the vacuum drying device on the base is within the non-display area.

In some embodiments, after the drying process is performed on the solution on the base by using the vacuum drying device, the method for manufacturing the display substrate further includes: performing a baking process on the plurality of thin films.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products or actual processes of a method to which the embodiments of the present disclosure relate.

DETAILED DESCRIPTION

Figure 1:
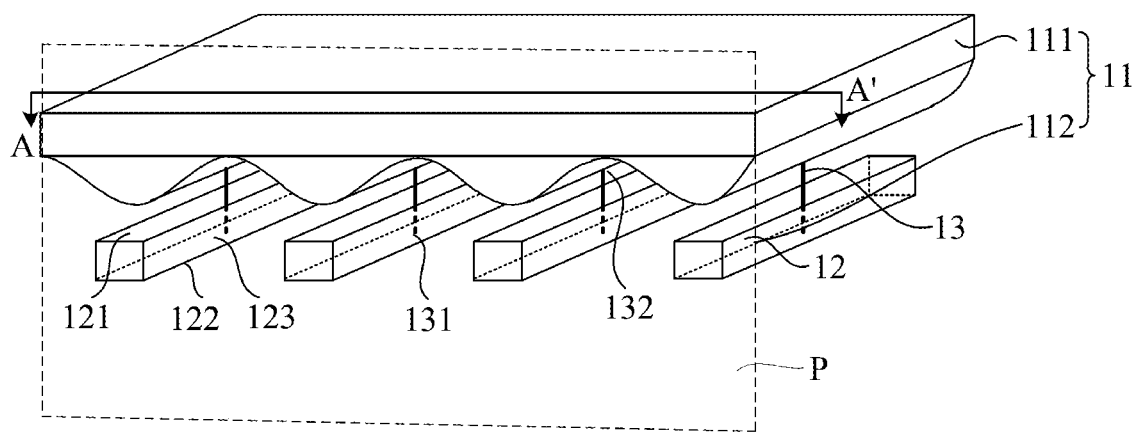
FIG. 1 is a structural diagram of a condensing assembly, in accordance with some embodiments of the present disclosure.

Technical solutions in some embodiments of the present disclosure will be described below clearly and completely with reference to the accompanying drawings. Obviously, the described embodiments are merely some but not all of embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the word "comprise" and other forms thereof, such as, the third-person singular form "comprises" and the present participle form "comprising" are construed as open and inclusive, i.e., "including, but not limited to". In the description, the terms such as "one embodiment", "some embodiments", "exemplary embodiments", "example" or "some examples" and the like are intended to indicate that specific features, structures, materials or characteristics related to the embodiment(s) or example(s) are included in at least one embodiment or example of the present disclosure. Schematic expressions of the above terms do not necessarily refer to the same embodiment(s) or example(s). In addition, the specific features, structures, materials or characteristics may be included in any one or more embodiments or examples in any suitable manner.

Hereinafter, words such as "first" and "second" are only used for descriptive purposes, and are not to be construed as indicating or implying the relative importance or implicitly indicating the number of indicated technical features. Thus, features defined as "first" and "second" may explicitly or implicitly include one or more of the features. In the description of the embodiments of the present disclosure, both the term "a plurality of" and "the plurality of" mean two or more unless otherwise specified.

In the description of some embodiments, the expression "connected" and its derivatives may be used. For example, the term "connected" may be used in the description of some embodiments to indicate that two or more components are in direct physical contact with each other.

The expression "at least one of A, B, and C" has a same meaning as the expression "at least one of A, B, or C", and both include the following combinations of A, B, and C: only A, only B, only C, a combination of A and B, a combination of A and C, a combination of B and C, and a combination of A, B, and C.

The expression "A and/or B" includes the following three combinations: only A, only B, and a combination of A and B.

An organic light-emitting diode (OLED) generally includes a plurality of thin films stacked in sequence, such as an emissive layer, a hole transport layer, or a hole injection layer. In the related art, methods for forming any one of the thin films (such as the emissive layer) mainly include vacuum evaporation and solution process. The vacuum evaporation is suitable for organic small-molecule materials, and has an advantage of uniform film formation. However, as for the vacuum evaporation, equipment investment is great, a material utilization rate is low, and in a case where the vacuum evaporation is applied to a large-sized product, alignment accuracy is low. The solution process includes inkjet printing or nozzle coating, and is suitable for polymer materials and soluble small-molecule materials. As for the solution process, an equipment cost is low, and in a case where the solution process is applied to a large-sized product, the solution may be accurately sprayed into pixel regions.

In the related art, after the solution is accurately sprayed in the pixel regions by using the solution process (e.g., the inkjet printing), a drying process needs to be performed on the solution in a vacuum drying (VCD) device, so as to evaporate solvent in the solution to form the emissive layer. However, in a process of performing the drying process on the solution, after the solvent in the solution is evaporated into gas, the gas easily comes into contact with a cold inner upper wall of the vacuum drying device, and is liquefied into liquid and drips back into the pixel regions, which easily makes a thickness of the final formed emissive layer non-uniform. Moreover, since it is difficult to know the dripping time of the solvent that has been gasified first and then liquefied, it is difficult to set drying conditions of the vacuum drying device to be good drying conditions, thereby easily making a quality of the final formed emissive layer lower than an expected quality. The above reasons may cause a mura phenomenon to appear on an image displayed by an OLED display device to which OLEDs are applied, which affects a display effect of the OLED display device.

On this basis, some embodiments of the present disclosure provide a condensing assembly 100. As shown in FIGS.

11 and 12, the condensing assembly 100 is applied to a vacuum drying device 200. The vacuum drying device 200 is configured to perform a drying process on a display substrate 300 manufactured by using an inkjet process.

Figure 2:
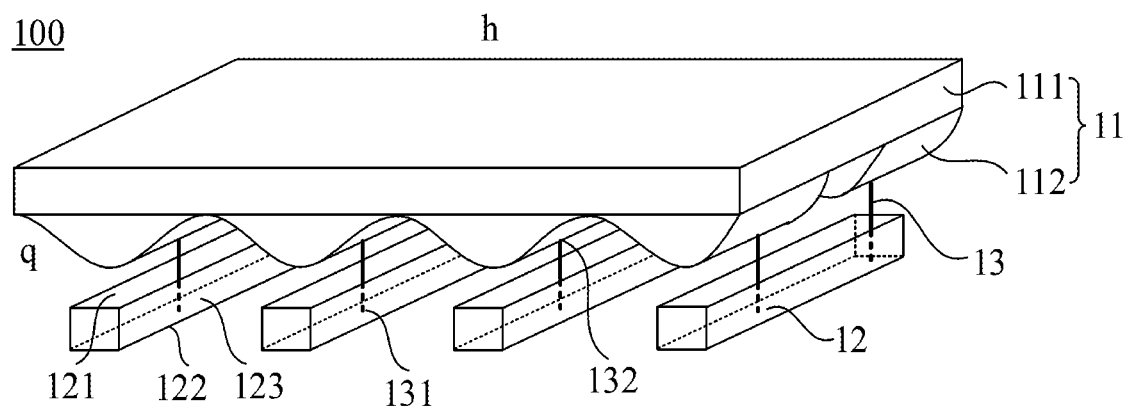
FIG. 2 is a structural diagram of another condensing assembly, in accordance with some embodiments of the present disclosure.
Figure 3:
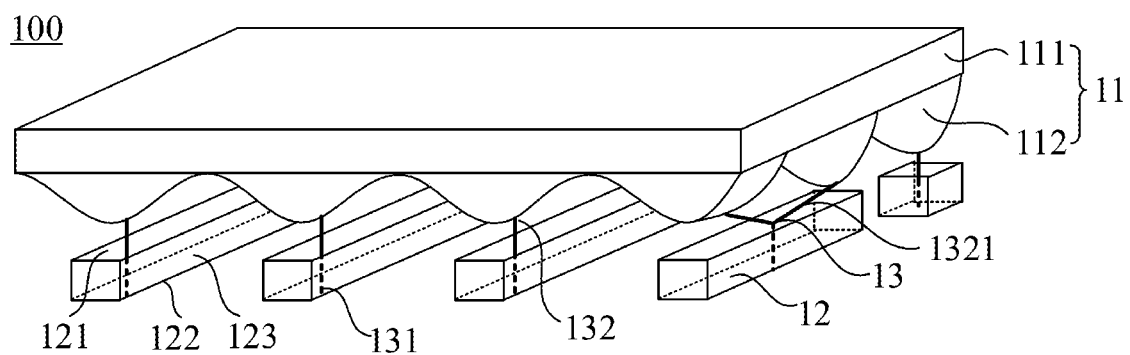
FIG. 3 is a structural diagram of yet another condensing assembly, in accordance with some embodiments of the present disclosure.

As shown in FIGS. 1 to 3, the condensing assembly 100 includes a condensation plate 11 and a plurality of sumps 12. The condensation plate 11 includes a plate body 111 and a plurality of protrusions 112 on a surface of the plate body 111, and the plurality of protrusions 112 are spaced apart. The plurality of sumps 12 are disposed at a side of the plurality of protrusions 112 away from the plate body 111. Each of the plurality of sumps 12 is disposed opposite to at least one of the plurality of protrusions 112, and an opening 121 of the sump 12 faces the at least one protrusion 112 disposed opposite to the sump 12. There is a gap between each sump 12 and the condensation plate 11.

There are a plurality of arrangements of the plurality of protrusions 112 in the condensation plate 11, which are not limited in the embodiments of the present disclosure.

Figure 6:
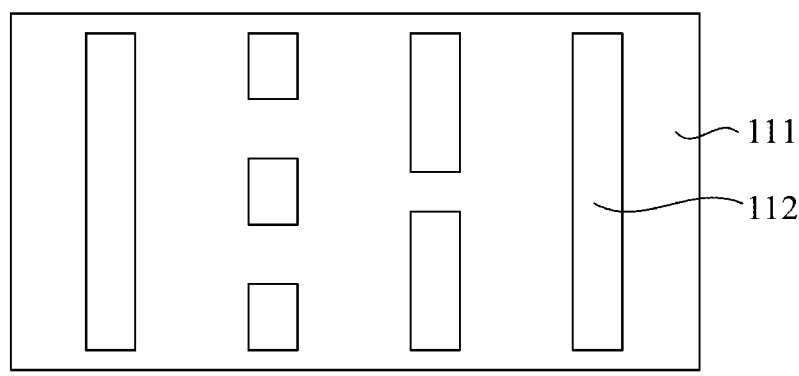
FIG. 6 is a bottom view of yet another condensing assembly, in accordance with some embodiments of the present disclosure.

For example, the plurality of protrusions 112 may be arranged irregularly. For example, as shown in FIG. 6, the plurality of protrusions 112 are arranged in a plurality of columns, and the number of protrusions 112 in each column is not constant.

For example, the plurality of protrusions 112 are arranged in an array. For example, as shown in FIGS. 4 and 5, the number of protrusions 112 in each column in the plurality of protrusions 112 is the same, and the number of protrusions 112 in each row is the same.

Figure 4:
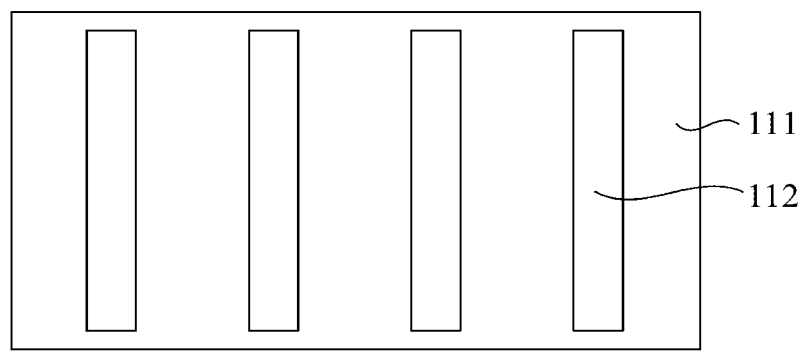
FIG. 4 is a bottom view of a condensing assembly, in accordance with some embodiments of the present disclosure.
Figure 5:
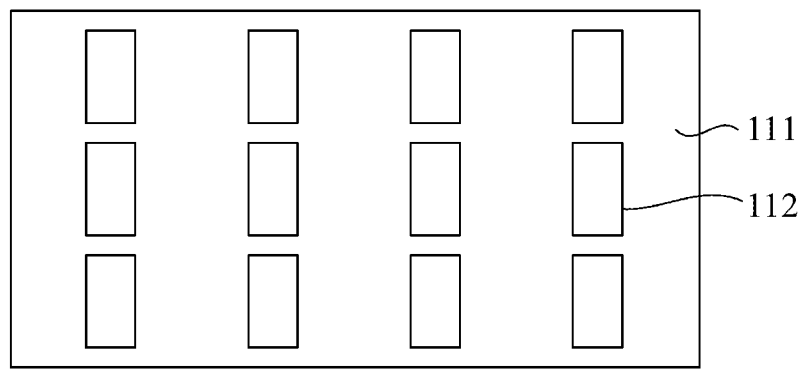
FIG. 5 is a bottom view of another condensing assembly, in accordance with some embodiments of the present disclosure.

In some examples, as shown in FIG. 4, the plurality of protrusions 112 are strip-shaped, and each protrusion 112 extends from one end of the plate body 111 to an opposite end thereof. Herein, the one end of the plate body 111 refers to a front end q or a rear end h of the plate body 111 shown in FIG. 2.

It will be noted that, although the plurality of protrusions extend from one end of the plate body 111 to the opposite end, the plurality of protrusions may be parallel to each other or may be arranged at a certain angle to each other. In some examples, as shown in FIG. 4, the plurality of protrusions 112 are parallel to each other, which is beneficial to simplifying a manufacturing process of the condensation plate 11.

The condensation plate 11 may condense the gas evaporated onto the condensation plate 11, so that the gas is liquefied and converted into liquid. The protrusions 112 may guide the liquid formed after the gas is liquefied on the surface of the condensation plate 11 where the protrusions 112 are disposed, so that the liquid flows to lowest points of the protrusions 112. Herein, the lowest points of the protrusions 112 may be the farthest points of the protrusions 112 from the plate body 111 in a direction perpendicular to the plate body 111.

The plurality of protrusions 112 in the condensation plate 11 have various shapes, which are not limited in the embodiments of the present disclosure, as long as the protrusions 112 are capable of guiding the liquid on the surface of the condensation plate 11 where the protrusions 112 are disposed to the lowest points of the protrusions 112.

In some examples, as shown in FIGS. 1 and 7 to 10, a shape of an orthographic projection of at least one protrusion 112 of the plurality of protrusions 112 on a plane P perpendicular to the plate body 111 is a rectangle, a triangle, a trapezoid, or a sector. That is, a shape of an orthographic projection of one of the plurality of protrusions 112 on the plane P perpendicular to the plate body 111 is a rectangle, a triangle, a trapezoid, or a sector; or, shapes of orthographic projections of at least two of the plurality of protrusions 112 on the plane P perpendicular to the plate body 111 are each a rectangle, a triangle, a trapezoid, or a sector. It will be understood that, the shapes of the orthographic projections of the at least two protrusions 112 on the plane P perpendicular to the plate body 111 may be the same or different.

Figure 7:
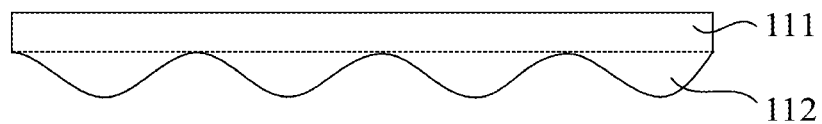
FIG. 7 is a sectional view of the condensation plate in FIG. 1 taken along A-A' direction.
Figure 8:
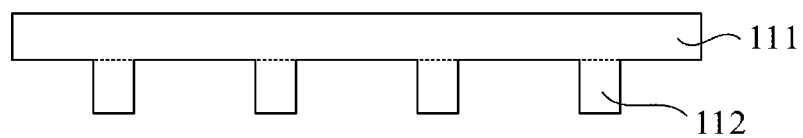
FIG. 8 is another sectional view of the condensation plate in FIG. 1 taken along A-A' direction.
Figure 9:
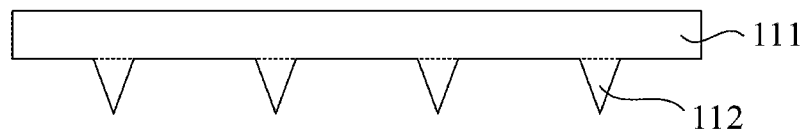
FIG. 9 is yet another sectional view of the condensation plate in FIG. 1 taken along A-A' direction.
Figure 10:
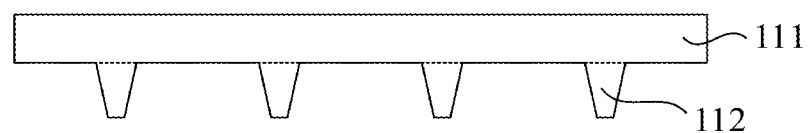
FIG. 10 is yet another sectional view of the condensation plate in FIG. 1 taken along A-A' direction.

For example, as shown in FIG. 8, shapes of orthographic projections of the protrusions 112 on the plane P perpendicular to the plate body 111 are rectangles. For another example, as shown in FIG. 9, the shapes of the orthographic projections of the protrusions 112 on the plane P perpendicular to the plate body 111 are triangles. For yet another example, as shown in FIG. 10, the shapes of the orthographic projections of the protrusions 112 on the plane P perpendicular to the plate body 111 are trapezoids. For yet another example, as shown in FIG. 7, the orthographic projections of the protrusions 112 on the plane P perpendicular to the plate body 111 have a wavelike shape, and the wavelike shape may be composed of sectors.

Herein, as shown in FIG. 1, the plane P perpendicular to the plate body 111 refers to a plane where a section of the plate body taken along the A-A' direction is located.

That each sump 12 is disposed opposite to at least one protrusion 112 may be that, the sumps 12 are in one-to-one correspondence with the protrusions 112. In this case, the number of the sumps 12 is equal to the number of the protrusions 112. Alternatively, that each sump 12 is disposed opposite to at least one protrusion 112 may be that, each sump 12 corresponds to multiple protrusions 112. In this case, the number of the sumps 12 is less than the number of the protrusions 112. The number of the sumps 12 and the number of the protrusions 112 are selectively set according to actual needs, and are not limited in the embodiments of the present disclosure.

The above "disposed opposite" may further be a directly opposite arrangement. That is, an orthographic projection of an end of the at least one protrusion 112 facing away from the plate body 111 on the plate body 111 substantially coincides with an orthographic projection of the sump 12 directly opposite to the at least one protrusion 112 on the plate body 111, or is located within a range of the orthographic projection of the sump 12 directly opposite to the at least one protrusion 112 on the plate body 111.

The opening 121 of the sump 12 faces the at least one protrusion 112 disposed opposite to the sump 12, so that liquid flowing to the lowest point of the at least one protrusion 112 can drip into the sump 12, thereby preventing the liquid from dripping out of the sump 12.

There is a gap between the sump 12 and the condensation plate 11. In some examples, the gap between the sump 12 and the condensation plate 11 is a gap between the sump 12 and the lowest point of the at least one protrusion 112 disposed opposite to the sump 12 in the direction perpendicular to the plate body 111.

Figure 12:
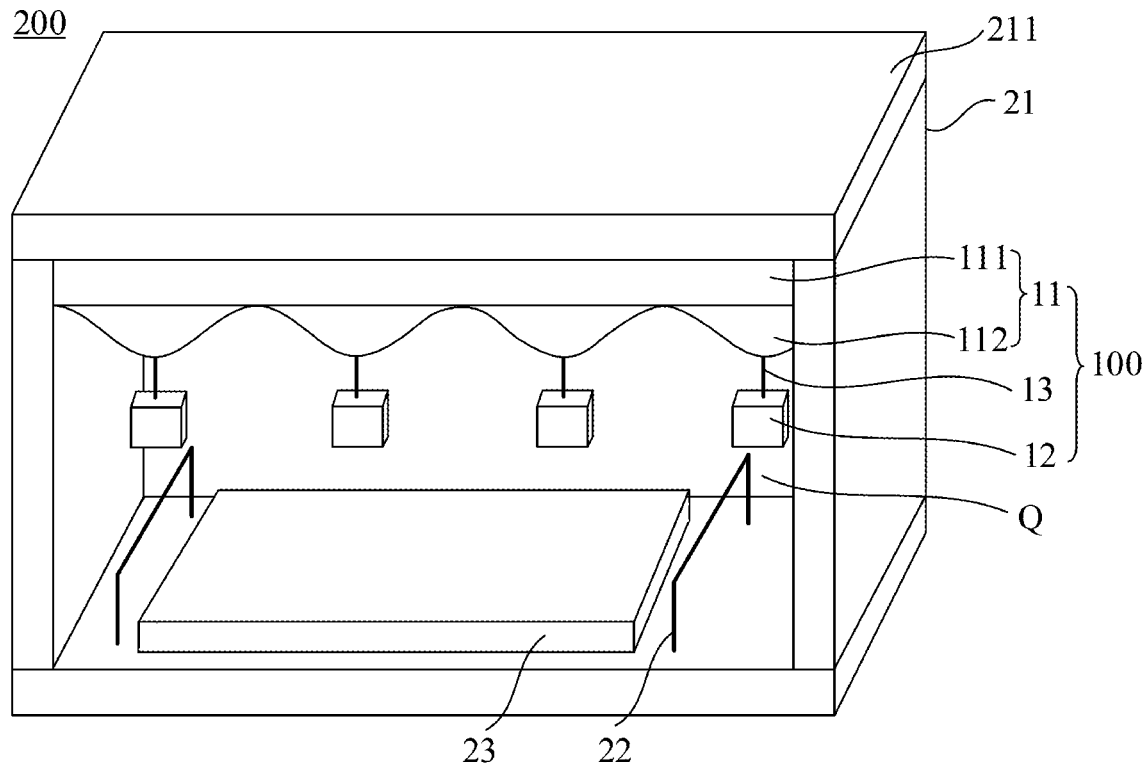
FIG. 12 is a structural diagram of a vacuum drying device, in accordance with some embodiments of the present disclosure.
Figure 13:
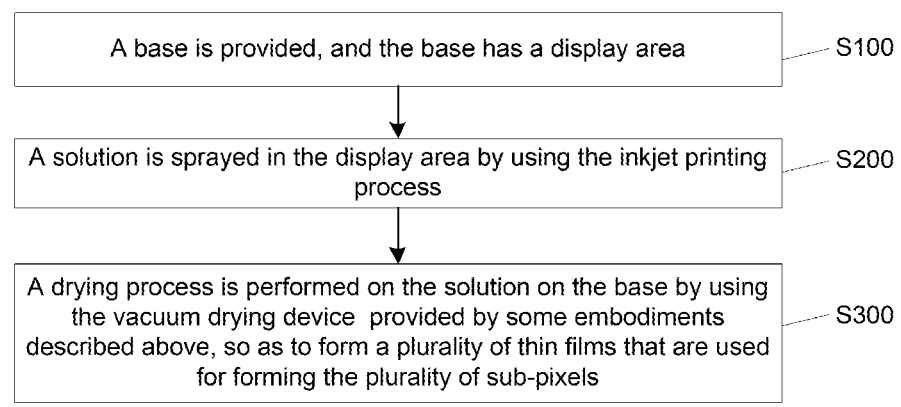
FIG. 13 is a flowchart of manufacturing a display substrate, in accordance with some embodiments of the present disclosure.

A size of the gap between the sump 12 and the condensation plate 11 is not limited in the embodiments of the present disclosure, and may be selectively set according to actual needs. In some examples, in the direction perpendicular to the plate body 111, the distance between the sump 12 and the condensation plate 11, i.e., a distance between the sump 12 and the at least one protrusion 112 disposed opposite to the sump 12, ranges from 5 mm to 100 mm. In this way, it is possible to ensure that the liquid flowing to the at least one protrusion 112 drips into the sump 12. Thereby, the liquid may be prevented from splashing out of the sump 12 during the process of dripping into the sump 12. Moreover, as shown in FIG. 12, in a case where the condensing assembly 100 is applied to the vacuum drying device 200, it is further possible to avoid influence on placement of an object to be dried in the vacuum drying device 200.

With regard to the condensing assembly 100 provided by the embodiments of the present disclosure, a plurality of protrusions 112 that are spaced apart are provided on a surface of the plate body 111 of the condensation plate 11, and a plurality of sumps 12 are provided at the side of the plurality of protrusions 112 away from the plate body 111; each sump 12 is disposed opposite to at least one protrusion 112, and the opening of the sump 12 faces the at least one protrusion 112. In this way, the gas evaporated onto the condensation plate 11 may be condensed by using the condensation plate 11, and is liquefied into the liquid. Then, each protrusion 112 is used to guide the liquid, so that the liquid can flow to a lowest point of the protrusion 112 and then drip into the sump 12. Thus, the collection of the liquid is achieved.

Moreover, in the case where the condensing assembly 100 provided by the embodiments of the present disclosure is applied to the vacuum drying device 200, the condensing assembly 100 may be used to liquefy and collect gas evaporated from the object to be dried, so as to prevent re-dripping of the liquid onto the object to be dried from affecting performance of the object to be dried.

Thus, if the object to be dried is the display substrate 300 manufactured by using the inkjet printing process, and the display substrate 300 is provided with a solution for forming emissive layers of OLEDs, solvent evaporated from the solution may be liquefied and collected by using the condensing assembly 100, so as to prevent the solvent from re-dripping onto the display substrate 300, thereby avoiding a mura phenomenon appearing on an image displayed by the display substrate 300 and avoiding a display effect of the display substrate 300 being affected.

In some examples, the plurality of protrusions 112 and the plate body 111 are of an integrated structure, which is beneficial to simplifying the manufacturing process of the condensation plate 11 and improving manufacturing efficiency of the condensing assembly 100.

In some examples, as shown in FIGS. 7, 9 and 10, a dimension of each protrusion 112 gradually decreases in a direction pointing from the plate body 111 to the plurality of sumps 12. Herein, the dimension of each protrusion 112 refers to a dimension of each protrusion 112 in a direction parallel to the plate body 111. This facilitates guiding the liquid, and thus make it easier for the liquid to flow to the lowest point of the protrusion 112.

A connection manner of the sump 12 and the at least one protrusion 112 disposed opposite to the sump 12 is not limited in the embodiments of the present disclosure, as long as there is a gap between the sump 12 and the at least one protrusion 112.

In some examples, as shown in FIGS. 1 to 3, the condensing assembly 100 further includes a plurality of connection members 13. A first end 131 of each connection member 13 of the plurality of connection members 13 is connected to a sump 12, and a second end 132 of the connection member 13 is connected to at least one protrusion 112 disposed opposite to the sump 12. That is, the sump 12 may be connected to the at least one protrusion 112 disposed opposite to the sump 12 through the connection member 13.

By providing a plurality of connection members 13, not only may each sump 12 be connected to corresponding at least one protrusion 112, but also the liquid flowing to the lowest point of each protrusion 112 may be guided into a corresponding sump 12 by using the plurality of connection members 13, thereby preventing the liquid from dripping or even splashing out of the sump 12.

Herein, there are a plurality of connection manners of sump 12 and the first end 131 of the connection member 13, which are not limited in the embodiments of the present disclosure, and may be selectively set according to actual needs.

In some examples, as shown in FIGS. 1 and 2, the first end 131 extends into the sump 12 from the opening 121 of the sump 12, and is connected to a bottom wall 122 of the sump 12.

In some other examples, as shown in FIG. 3, the first end 131 extends into the sump 12 from the opening 121 of the sump 12, and is connected to a side wall 123 of the sump 12.

Herein, that the second end 132 of the connection member 13 is connected to the condensation plate 11 includes that the second end 132 is connected to the plate body 111 of the condensation plate 11, or that the second end 132 is connected to the at least one protrusion 112 disposed opposite to the sump 12.

In a case where the second end 132 is connected to the plate body 111 of the condensation plate 11, the connection member 13 may be used for guiding the liquid condensed on the plate body 111 and not condensed on the protrusion(s) 112, so that the liquid can flow into the sump 12 through the connection member 13.

In a case where the second end 132 is connected to the at least one protrusion 112 disposed opposite to the sump 12, there are a plurality of connection manners.

In some examples, as shown in FIGS. 1 and 2, the second end 132 is connected to one protrusion 112 of the at least one protrusion 112 corresponding to the sump 12. In this case, the connection member 13 may be rod-shaped or strip-shaped.

In some other examples, as shown in FIG. 3, the second end 132 includes at least one connecting sub-end 1321 that is correspondingly connected to the at least one protrusion 112 corresponding to the sump 12. In this case, the connection member 13 may be claw-shaped. That is, the connection member 13 includes a first rod portion and a plurality of second rod portions connected to one end of the first rod portion. A free end of the first rod portion is the first end 131, a free end of each second rod portion is a connecting sub-end 1321, and each connecting sub-end 1321 is correspondingly connected to a protrusion 112.

In addition, each sump 12 may be connected to at least one protrusion 112 disposed opposite to the sump 12 through one connection member 13, or may be connected to the at least one protrusion 112 disposed opposite to the sump 12 through a plurality of connection members 13.

There are a plurality of manners for the sump 12 to connect to the condensation plate 11 through corresponding connection member(s) 13.

In some examples, the sump 12 is fixedly connected to the condensation plate 11 through the corresponding connection member(s) 13. That is, the first end 131 of the connection member 13 is fixedly connected to the sump 12, and the second end 132 is fixedly connected to the condensation plate 11.

In some other examples, the sump 12 is detachably connected to the condensation plate 11 through the corresponding connection member(s) 13. That is, the first end 131 of the connection member 13 is fixedly connected to the sump 12, and the second end 132 is detachably connected to the condensation plate 11; or, the first end 131 of the connection member 13 is detachably connected to the sump 12, and the second end 132 is fixedly connected to the condensation plate 11; or the first end 131 of the connection member 13 is detachably connected to the sump 12, and the second end 132 is detachably connected to the condensation plate 11.

Figure 11:
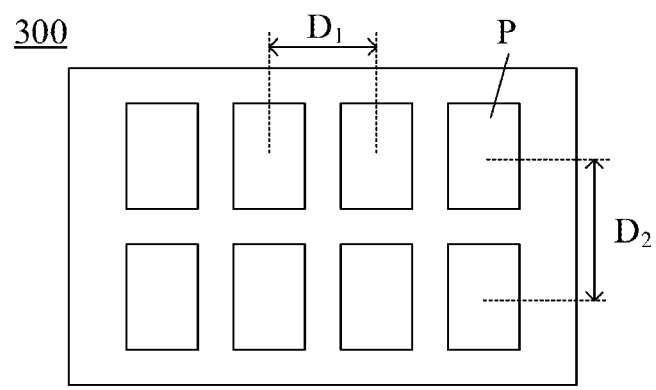
FIG. 11 is a structural diagram of a display substrate, in accordance with some embodiments of the present disclosure.

In some embodiments, as shown in FIGS. 11 and 12, the display substrate 300 includes a plurality of sub-pixels P. A distance between centers of every two adjacent protrusions 112 is an integer multiple of a distance between centers of two adjacent sub-pixels P in the plurality of sub-pixels P.

For example, the distance between the centers of every two adjacent protrusions 112 is once, twice, or three times the distance between the centers of two adjacent sub-pixels P.

In some examples, as shown in FIG. 11, the distance between the centers of two adjacent sub-pixels P is, for example, a distance $D_1$ between centers of two adjacent sub-pixels P in a row arrangement direction of the plurality of sub-pixels P. Alternatively, the distance between the centers of two adjacent sub-pixels P is, for example, a distance $D_2$ between centers of two adjacent sub-pixels P in a column arrangement direction of the plurality of sub-pixels P.

For example, the display substrate 300 has a pixels per inch (PPI) of 200. In the row arrangement direction of the plurality of sub-pixels P, the distance $D_1$ between the centers of two adjacent sub-pixels P is 30 μm. In this case, the distance between the centers of every two adjacent protrusions 112 is n by 30 μm. In the column arrangement direction of the plurality of sub-pixels P, the distance $D_2$ between the centers of two adjacent sub-pixels P is 100 μm. In this case, the distance between the centers of every two adjacent protrusions 112 is n by 100 μm. The above n is a positive integer.

In some examples, a multiple relationship between the distance between the centers of every two adjacent protrusions 112 and the distance between the centers of two adjacent sub-pixels P is related to a content of solvent in a solution to be dried in the display substrate 300 and a volume of each sump 12. The above multiple relationship may be determined according to practical applications.

In the embodiments of the present disclosure, by setting the distance between the centers of every two adjacent protrusions 112 to be an integer multiple of the distance between the centers of two adjacent sub-pixels P, when the display substrate 300 is dried by using the vacuum drying device, an orthographic projection of each protrusion 112 on the display substrate 300 may be between two adjacent sub-pixels P. In this way, not only may the solvent evaporated from the display substrate 300 be collected by using the sumps 12, but also the solvent may drip into a region between adjacent sub-pixels P in a case where the solvent does not drip into the sumps 12. Thereby, a uniformity of thicknesses of a thin film in a sub-pixel (e.g., an emissive layer, a hole injection layer, or a hole transport layer) may not be affected.

Herein, the volume of each sump 12 is related to the number of the sumps 12, and a total volume of all sumps 12 should be sufficient to accommodate all solvent in the object to be dried.

For example, when the emissive layer of the display substrate 300 is formed by using the inkjet printing process, the solution for forming the emissive layer needs to be sprayed in the pixel regions by using the inkjet printing process. In this case, the total volume of all sumps 12 should be sufficient to accommodate the solvent in the solution for forming the emissive layer.

In some examples, the number of the plurality of sumps 12 is x, and the number of the plurality of sub-pixels P is M by N. The volume of each sump is in a range of $$\frac{M \times N \times 18}{x} pL \text{ to } \frac{M \times N \times 25}{x} pL,$$

where M, N and x are all positive integers, and pL is a unit of volume, i.e., picoliter.

When the thin film of the display substrate (e.g., the emissive layer, the hole injection layer, or the hole transport layer) is formed by using the inkjet printing process, a solution of 18 pL to 25 pL is usually printed in a sub-pixel region corresponding to each sub-pixel P. There is little solute in the solution, and a content of the solute may be negligible compared with a content of solvent. Therefore, the content of the solvent in each sub-pixel region may be regarded as the same as the content of the solution, that is, the content of the solvent in each sub-pixel region is in a range of 18 pL to 25 pL.

Hereinafter, in an example where the emissive layer of the display substrate is formed by using the inkjet printing process, and the display substrate is assumed to include 1924 by 1080 sub-pixels, then a volume of solvent required to be dried for forming the emissive layer is in a range of 1924×1080×18 pL to 1924×1080×25 pL.

The solvent is evaporated onto the condensation plate 11 after being dried, and is liquefied into liquid when cooled. It is assumed that the solvent is totally evaporated onto the condensation plate 11 and is totally liquefied into liquid, then the x sumps 12 should be sufficient to accommodate a liquid of 1924×1080×18 pL to 1924×1080×25 pL. Therefore, the volume of each sump 12 is in a range of $$\frac{1924 \times 1080 \times 18}{x} pL \text{ to } \frac{1924 \times 1080 \times 25}{x} pL.$$

In the embodiments of the present disclosure, by setting the volume of each sump 12 to be in the range of $$\frac{1924 \times 1080 \times 18}{x} pL \text{ to } \frac{1924 \times 1080 \times 25}{x} pL,$$

it is possible to accommodate the liquid liquefied by the solvent evaporated from the display substrate 300, thereby preventing the liquid from overflowing from the sumps 12 and dripping onto the display substrate 300.

Some embodiments of the present disclosure provide a vacuum drying device 200. As shown in FIG. 12, the vacuum drying device 200 includes a chamber body 21 and the condensing assembly 100 provided by some embodiments described above. The chamber body 21 includes a top wall 211, and has a chamber Q. The condensing assembly 100 is located in the chamber Q and is disposed on the top wall 211. The plurality of sumps 12 in the condensing assembly 100 are located at a side of the condensation plate 11 in the condensing assembly 100 away from the top wall 211.

There are various shapes of the chamber body 21. For example, the shape of the chamber body 21 is a cube or a cuboid.

There are a plurality of manners in which the condensing assembly 100 is arranged on the top wall 211. For example, the condensing assembly 100 is fixedly arranged on the top wall 211, or the condensing assembly 100 is detachably arranged on the top wall 211.

Beneficial effects that may be achieved by the condensing assembly 100 in the vacuum drying device 200 provided by the embodiments of the present disclosure are the same as beneficial effects that may be achieved by the condensing assembly 100 provided by some embodiments described above, and details are not repeated herein.

In some embodiments, the vacuum drying device 200 is configured to perform a drying process on the display substrate 300 manufactured by using the inkjet process. As shown in FIGS. 11 and 12, the vacuum drying device 200 further includes a carrier support 22. The carrier support 22 is disposed in the chamber Q, and is disposed opposite to the condensing assembly 100. The carrier support 22 is configured to carry the display substrate 300, and is configured such that the display substrate 300 is located between the carrier support 22 and the condensing assembly 100.

In some examples, the carrier support 22 may have a same or similar shape as the display substrate 300, as long as edges of the display substrate 300 can be placed on the carrier support 22, so that the carrier support 22 is capable of well supporting the display substrate 300.

In some embodiments, the vacuum drying device 200 is configured to perform the drying process on the display substrate 300 manufactured by using the inkjet process. As shown in FIGS. 11 and 12, the vacuum drying device 200 further includes a baking device 23. The baking device 23 is located in the chamber Q. The baking device 23 is configured to perform a baking process on the display substrate 300 after the drying process is performed on the display substrate 300.

In some examples, the baking device 23 is, for example, a hot plate capable of heating.

A position of the baking device 23 in the chamber Q is not limited in the embodiments of the present disclosure, as long as the display substrate 300 can be baked. For example, the baking device 23 is disposed on a bottom wall of the chamber body 21.

Some embodiments of the present disclosure provide a method for manufacturing a display substrate, and the display substrate includes a plurality of sub-pixels P. As shown in FIGS. 11 and 13 to 15, the method for manufacturing the display substrate includes S100 to S300.

In S100, a base 400 is provided. The base has a display area B.

The base 400 can have various types. For example, the base 400 is a flexible base, or the base 400 is a rigid base.

In S200, a solution is sprayed in the display area B by using the inkjet printing process.

Herein, there are a plurality of sub-pixel regions b in the display area B. The above description that a solution is sprayed in the display area B means that the solution is sprayed in the plurality of sub-pixel regions b in the display area B. Herein, solutions in every two adjacent sub-pixel regions b are separated from each other, and are not connected.

In S300, a drying process is performed on the solution on the base 400 by using the vacuum drying device 200 provided by some embodiments described above, so as to form a plurality of thin films that are used for forming the plurality of sub-pixels in the display substrate 300.

Herein, after the drying process is performed on the solution on the base 400, solvent in the solution is evaporated, and retained solute forms a plurality of thin films. The plurality of thin films are disposed in a same layer.

The "same layer" herein means that a film layer for forming specific patterns is formed by using a same film forming process, and the specific patterns in a layer structure may be continuous or discontinuous, and these specific patterns may further be at different heights or have different thicknesses.

Each of the plurality of thin films corresponds to a sub-pixel region b, and each thin film is used to form a sub-pixel P.

In some examples, the base 400 is an OLED base, and the OLED on the base 400 has a stacked structure composed of multiple thin films. At least one of the plurality of thin films may be formed by using the inkjet printing process. For example, the emissive layer, the hole transport layer, and the hole injection layer in the OLED may all be formed by using respective inkjet printing processes.

For example, the solution on the base 400 is a solution for forming the emissive layer of the OLED. After the drying process is performed on the solution, a thin film formed by the retained solute is an emmissive film, and each pattern in the emmissive film corresponds to an emissive layer in an OLED.

Herein, when the drying process is performed on the solution on the base 400 by using the vacuum drying device 200, the base 400 may be placed on a carrier substrate 22, so that the base 400 is opposite to the condensing assembly 100.

In the method for manufacturing a display substrate provided by the embodiments of the present disclosure, after the solution is sprayed in the display area B on the base 400 by using the inkjet printing process, by using the vacuum drying device 200 provided by some embodiments described above to perform the drying process on the solution on the base 400, after the solvent in the solution is evaporated onto the condensation plate 11 and is liquefied into liquid, the plurality of protrusions 112 in the condensation plate 11 may be used for guiding the liquid, so that the liquid can flow to the lowest points of the protrusions 112 and flow into the sumps 12 due to gravity. In this way, the liquid formed after the solvent is liquefied may be prevented from re-dripping into the display area, thereby avoiding the mura phenomenon appearing on the image displayed by the display substrate 300 that is subsequently formed and avoiding the display effect of the display substrate 300 being affected.

There are various arrangements of the plurality of sumps 12 in the vacuum drying device 200 in the embodiments of the present disclosure.

Figure 14:
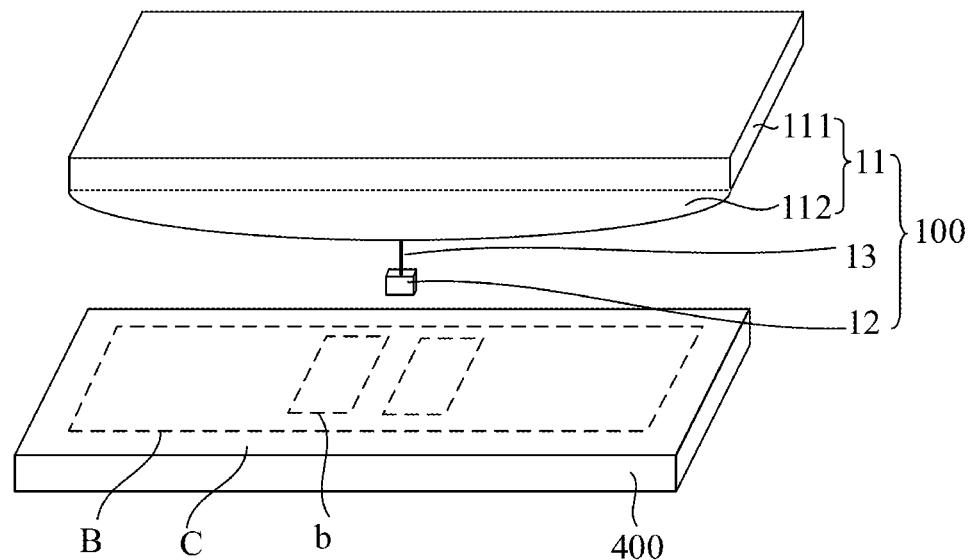
FIG. 14 is a diagram showing a positional relationship between a base and a condensing assembly, in accordance with some embodiments of the present disclosure.

In some examples, as shown in FIG. 14, an orthographic projection of at least one sump 12 of the plurality of sumps 12 in the vacuum drying device 200 on the base 400 is within a region between two adjacent sub-pixel regions b in the plurality of sub-pixel regions b.

Herein, orthographic projections of multiple sumps 12 on the base 400 may be within respective regions each between two adjacent sub-pixel regions b, or an orthographic projection of one sump 12 of the plurality of sumps 12 on the base 400 is within the region between two adjacent sub-pixel regions b. FIG. 14 shows a case where the condensing assembly 100 in the vacuum drying device 200 includes only one sump 12, and an orthographic projection of the sump 12 on the base 400 is within a region between two adjacent sub-pixel regions b.

A person skilled in the art will understand that, the display substrate 300 should include thousands or even tens of thousands of sub-pixel regions b. FIG. 14 only shows two sub-pixel regions b, and for convenience of illustration, a size of each sub-pixel region b in FIG. 14 is much greater than a size of a sub-pixel region in a display substrate in practical applications.

In the embodiments of the present disclosure, by making the orthographic projection of the at least one sump 12 of the plurality of sumps 12 on the base 400 be within the region between two adjacent sub-pixel regions b, the liquid may drip into a region between any two adjacent sub-pixels b in a case where the liquid does not drip into the sumps 12, thereby preventing dripping of the liquid into a sub-pixel region b from affecting uniformity of thicknesses of thin films in the sub-pixel region b.

Figure 15:
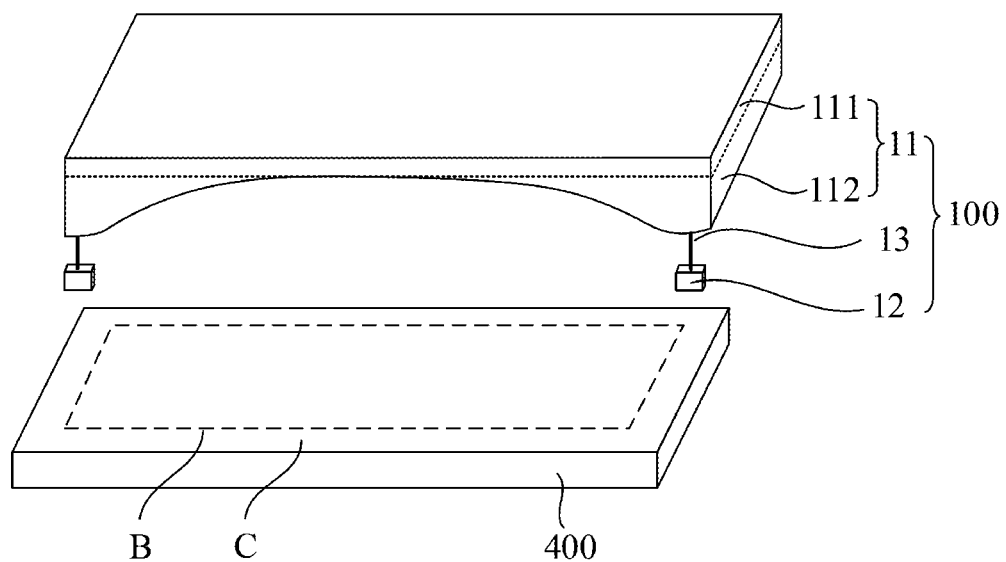
FIG. 15 is a diagram showing another positional relationship between a base and a condensing assembly, in accordance with some embodiments of the present disclosure.

In some other examples, as shown in FIG. 15, the base 400 further has a non-display area C located beside the display area B, and an orthographic projection of at least one sump 12 of the plurality of sumps 12 in the vacuum drying device 200 on the base 400 is within the non-display area C. The non-display area C may be disposed around the display area B, or may be disposed only in a region corresponding to at least one side of the base 400.

In the embodiments of the present disclosure, by making the orthographic projection of the at least one sump 12 of the plurality of sumps 12 on the base 400 is within the non-display area C, the liquid may drip into the non-display area C in the case where the liquid does not drip into the sumps 12, thereby preventing dripping of the liquid into a sub-pixel region b from affecting uniformity of thicknesses of thin films in the sub-pixel region b.

In some embodiments, after the drying process is performed on the solution on the base 400 by using the vacuum drying device 200, the method for manufacturing the display substrate further includes performing a baking process on the plurality of thin films.

Herein, in a case where multiple thin films in the OLED on the base 400 are all formed by using the inkjet printing process, as for the formation of any one layer of the thin film, inkjet printing is performed first, then the drying process is performed on the solution spayed by using the inkjet printing process, and finally the retained solute after drying is baked. After that, a next film is formed.

In the embodiments of the present disclosure, after the drying process is performed on the solution on the base 400 and a plurality of thin films is formed, the baking process is performed on the plurality of thin films. In this way, on one hand, residual solvent may be removed; on another hand, molecules in each thin film may be cross-linked. Thereby, that solvent in solution for forming subsequent thin films permeates into thin films that have been formed, which causes solute in the thin films that have been formed to be dissolved, and further affects a material of the thin films that have been formed, may be prevented.

In addition, a device for baking the thin films may be a device different from the vacuum drying device 200. The device may further be a same device as the vacuum drying device 200 in a case where baking conditions do not affect performance of the vacuum drying device 200. That is, the vacuum drying device 200 is not only capable of performing the drying process on the solution on the base 400 but also capable of performing the baking process on the thin films on the base 400.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A condensing assembly, comprising:
a condensation plate, including a plate body and a plurality of protrusions on a surface of the plate body, the plurality of protrusions being spaced apart, and a surface of an end of at least one protrusion of the plurality of protrusions away from the plate body being continuous;
a plurality of sumps disposed at a side of the plurality of protrusions away from the plate body, each sump of the plurality of sumps being disposed opposite to at the least one protrusion, and an opening of the sump facing the at least one protrusion disposed opposite to the sump; and
a plurality of connection members, a first end of one of the plurality of connection members being connected to the sump, and a second end of the connection member being connected to the condensation plate,
wherein there is a gap between the plurality of sumps and the condensation plate, and
wherein a dimension of the protrusion gradually decreases in a direction pointing from the plate body to the plurality of sumps.

2. The condensing assembly according to claim 1, wherein the first end extends into the sump from the opening of the sump, and is connected to a bottom wall or a side wall of the sump; and
the second end is connected to the at least one protrusion disposed opposite to the sump.

3. The condensing assembly according to claim 1, wherein the sump is fixedly connected to the condensation plate through the connection member; or
the sump is detachably connected to the condensation plate through the connection member.

4. The condensing assembly according to claim 1, wherein the plurality of protrusions are arranged in an array.

5. The condensing assembly according to claim 1, wherein each protrusion of the plurality of protrusions is strip-shaped, and the protrusion extends from one end of the plate body to an opposite end of the plate body.

6. The condensing assembly according to claim 5, wherein the plurality of protrusions are parallel to each other.

7. The condensing assembly according to claim 1, wherein a shape of an orthographic projection of at least one of the plurality of protrusions on a plane perpendicular to the plate body is one of a rectangle, a triangle, a trapezoid, and a sector.

8. The condensing assembly according to claim 1, wherein in a direction perpendicular to the plate body, a distance between the sumps and the condensation plate is in a range of 5 mm to 100 mm.

9. A vacuum drying device, comprising:
a chamber body inducting a top wall; and
the condensing assembly according to claim 1, the condensing assembly being located in a chamber of the chamber body and disposed on the top wall, the plurality of sumps of the condensing assembly being located at a side of the condensation plate of the condensing assembly away from the top wall.

10. The vacuum drying device according to claim 9, wherein the vacuum drying device is configured to perform a drying process on a display substrate manufactured by using an inkjet process, wherein the vacuum drying device further comprises at least one of:
- a carrier support located in the chamber and disposed opposite to the condensing assembly, wherein the carrier support is configured to support the display substrate such that the display substrate is located between the carrier support and the condensing assembly; or
- a baking device located in the chamber, wherein the baking device is configured to perform a baking process on the display substrate after the drying process is performed on the display substrate.

11. A method for manufacturing a display substrate, the method comprising:
    providing a base, wherein the base has a display area;
    spraying a solution in the display area by using an inkjet printing process; and
    performing a drying process on the solution on the base by using the vacuum drying device according to claim 9 to form a plurality of thin films, wherein the plurality of thin films are used to form a plurality of sub-pixels.

12. The method for manufacturing the display substrate according to claim 11, wherein the display area includes a plurality of sub-pixel regions corresponding to the plurality of sub-pixels, and
    wherein the base is placed such that an orthographic projection of at least one of the plurality of sumps in the vacuum drying device on the base is within a region between two adjacent sub-pixel regions in the plurality of sub-pixel regions.

13. The method for manufacturing the display substrate according to claim 11, wherein the base further has a non-display area located beside the display area, and
    wherein the base is placed such that an orthographic projection of at least one of the plurality of sumps in the vacuum drying device on the base is within the non-display area.

14. The method for manufacturing the display substrate according to claim 11, wherein after the drying process is performed on the solution on the base by using the vacuum drying device, the method for manufacturing the display substrate further comprises:
    performing a baking process on the plurality of thin films.

15. The condensing assembly according to claim 2, wherein the sump is fixedly connected to the condensation plate through the connection member; or
    the sump is detachably connected to the condensation plate through the connection member.

16. The condensing assembly according to claim 3, wherein the plurality of protrusions are arranged in an array.

17. The condensing assembly according to claim 4, wherein each protrusion of the plurality of protrusions is strip-shaped, and the protrusion extends from one end of the plate body to an opposite end of the plate body.

18. The condensing assembly according to claim 6, wherein a shape of an orthographic projection of at least one of the plurality of protrusions on a plane perpendicular to the plate body is one of a rectangle, a triangle, a trapezoid, and a sector.

* * * * *